(12) United States Patent
Enrici et al.

(10) Patent No.: US 11,579,894 B2
(45) Date of Patent: Feb. 14, 2023

(54) DETERMINISTIC DYNAMIC RECONFIGURATION OF INTERCONNECTS WITHIN PROGRAMMABLE NETWORK-BASED DEVICES

(71) Applicant: Nokia Solutions and Networks Oy, Espoo (FI)

(72) Inventors: Andrea Enrici, Bourg la Reine (FR); Bogdan Uscumlic, Les Ulis (FR)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 17/081,555

(22) Filed: Oct. 27, 2020

(65) Prior Publication Data

US 2022/0129280 A1  Apr. 28, 2022

(51) Int. Cl.
*G06F 9/4401* (2018.01)
*G06F 13/40* (2006.01)

(52) U.S. Cl.
CPC ........ *G06F 9/4411* (2013.01); *G06F 13/4027* (2013.01)

(58) Field of Classification Search
CPC ............................. G06F 13/4027; G06F 9/4411
See application file for complete search history.

(56) References Cited

U.S. PATENT DOCUMENTS

| | | | | |
|---|---|---|---|---|
| 6,242,947 B1 * | 6/2001 | Trimberger | ...... | H03K 19/17736 326/38 |
| 6,678,646 B1 * | 1/2004 | McConnell | ............. | G06F 30/39 703/22 |
| 7,071,732 B1 * | 7/2006 | Jang | ................. | H03K 19/17736 326/38 |
| 7,380,232 B1 * | 5/2008 | Schumacher | .......... | G06F 30/34 716/104 |
| 8,058,899 B2 * | 11/2011 | Vorbach | .................. | G06F 15/82 326/39 |
| 2004/0174187 A1 | 9/2004 | New | | |
| 2016/0154681 A1 * | 6/2016 | Chen | ..................... | G06F 9/5083 718/105 |
| 2019/0131975 A1 | 5/2019 | Raghava et al. | | |
| 2019/0146943 A1 * | 5/2019 | Fender | ................ | G06F 13/4072 710/105 |
| 2019/0296744 A1 | 9/2019 | Wallichs et al. | | |
| 2021/0081763 A1 * | 3/2021 | Abdelfattah | ........... | G06N 7/005 |

(Continued)

OTHER PUBLICATIONS

Altera White Paper, "Comparing IP integration approaches for FPGA implementation" Feb. 2007, ver. 1.1., Available at: https://www.intel.com/content/dam/www/programmable/us/en/pdfs/literature/wp/wp-01032.pdf.

(Continued)

*Primary Examiner* — Nimesh G Patel
(74) *Attorney, Agent, or Firm* — Harness, Dickey & Pierce, P.L.C.

(57) ABSTRACT

A device includes a plurality of reconfigurable resources, a bus, and a configurator. The bus interconnects the plurality of reconfigurable resources. The configurator is configured to deterministically compute a segmented interconnect configuration for the bus based on operational parameters associated with the device and operational constraints associated with program modules to be executed by the plurality of reconfigurable resources.

16 Claims, 3 Drawing Sheets

(56) References Cited

U.S. PATENT DOCUMENTS

2021/0110069 A1* 4/2021 Trivedi .............. G06F 11/0772

OTHER PUBLICATIONS

Tiberiu Seceleanu et al., "The SegBus platform—architecture and communication mechanisms," Journal of System Architectures, vol. 53, issue 4, pp. 151-169 (2007).

Seceleanu et al *"Improving the performance of bus platforms by means of segmentation and optimized resource allocation,"* EURASIP Journal of Embedded Systems, 2009, article n. 3.

Seceleanu et al. *"On-chip Segmented Bus: A Self-Timed Approach,"* ASIC/SoC conference, 2002, pp. 216-221.

Gharbi, et al., *"Efficient and Exact Design Space Exploration for Heterogeneous and Multi-Bus Platforms,"* Euromicro DSD, Year 2020, vol. 1, pp. 16-23.

Fei Chen et al., "Enabling FPGAs in the cloud," Proceedings of the 11 th ACM Conference on Computing Frontiers, May 2014, and retrieved from <http://nics.ee.tsinghua.edu.cn/people/wangyu/Enabling%20FPGAs%20in%20the%20Cloud.pdf>.

IBM, "cloudFPGA; Field programmable gate arrays for the cloud," retrieved from internet: <https://www.zurich.ibm.com/cci/cloudFPGA/> on Oct. 26, 2020.

Huawei, "FX-Series FPGA Accelerator Cards; Unlock new levels of energy efficiency to turbocharge data centers," Retrieved from Internet: <https://e.huawei.com/en/products/servers/pcie-ssd/fpga>> on Oct. 26, 2020.

Huawei, "FPGA Accelerated Cloud Server," retrieved from Internet: <https://www.huaweicloud.com/en-us/product/fcs.html> on Oct. 26, 2020.

Oracle, "FPGA Offload," Retrieved from Internet: <https://labs.oracle.com/pls/apex/f?p=LABS:project_details:0:128> on Oct. 26, 2020.

Extended European Search Report dated Mar. 15, 2022 in European Application No. 21198656.7.

* cited by examiner

DETERMINISTIC DYNAMIC RECONFIGURATION OF INTERCONNECTS WITHIN PROGRAMMABLE NETWORK-BASED DEVICES

BACKGROUND

A field-programmable gate array (FPGA) is an integrated circuit designed to be configured or re-configured after manufacture. FPGAs contain an array of Configurable Logic Blocks (CLBs), and a hierarchy of reconfigurable interconnects that allow these blocks to be wired together, like many logic gates that can be inter-wired in different configurations. CLBs may be configured to perform complex combinational functions, or simple logic gates like AND and XOR. CLBs also include memory blocks, which may be simple flip-flops or more complete blocks of memory, and specialized Digital Signal Processing blocks (DSPs) configured to execute some common operations (e.g., filters).

SUMMARY

The scope of protection sought for various example embodiments of the disclosure is set out by the independent claims. The example embodiments and/or features, if any, described in this specification that do not fall under the scope of the independent claims are to be interpreted as examples useful for understanding various embodiments.

One or more example embodiments provide a field-programmable gate array (FPGA) architecture that may enable more efficient and/or flexible access to different programming modules over partial reconfiguration slots of an FPGA.

At least one example embodiment provides a device comprising: a plurality of reconfigurable resources; a bus interconnecting the plurality of reconfigurable resources; and a configurator configured to deterministically compute a segmented interconnect configuration for the bus based on operational parameters associated with the device and operational constraints associated with program modules (e.g., P4 modules) to be executed by the plurality of reconfigurable resources.

At least one example embodiment provides a device comprising: a plurality of reconfigurable resources; a bus interconnecting the plurality of reconfigurable resources; and means for deterministically computing a segmented interconnect configuration for the bus based on operational parameters associated with the device and operational constraints associated with program modules (e.g., P4 modules) to be executed by the plurality of reconfigurable resources.

At least one example embodiment provides a method for configuring a device, the method comprising: deterministically computing a segmented interconnect configuration for the bus based on operational parameters associated with the device and operational constraints associated with program modules (e.g., P4 modules) to be executed by a plurality of reconfigurable resources.

At least one example embodiment provides a non-transitory computer-readable storage medium storing computer-readable instructions that, when executed at device architecture, cause the device architecture to perform a method for configuring a device, the method comprising: deterministically computing a segmented interconnect configuration for the bus based on operational parameters associated with the device and operational constraints associated with program modules (e.g., P4 modules) to be executed by a plurality of reconfigurable resources.

The device may be a field programmable gate array (FPGA), or other programmable device or programmable logic device. The bus may be a FPGA bus, and the configurator may be a FPGA configurator.

The plurality of reconfigurable resources may include a plurality of partial reconfiguration slots, the plurality of partial reconfiguration slots being reconfigurable without interrupting operation of the FPGA.

The operational parameters may include a spatial and temporal allocation of the plurality of reconfigurable resources at the FPGA.

The FPGA bus may include a plurality of FPGA bus segments, and the segmented FPGA interconnect configuration may include operational characteristics associated with the FPGA bus segments.

The operational characteristics associated with an FPGA bus segment among the FPGA bus segments may include at least one of: a bandwidth, a number of inter-segment buffers, or a number of segment-module buffers.

The program modules may be Programming Protocol-independent Packet Processors (P4) modules.

The operational constraints may include timing constraints for the program modules.

At least one other example embodiment provides a device architecture comprising: a configuration manager including at least one processor and at least one memory including computer program code, the at least one memory and the computer program code configured to, with the at least one processor, cause the configuration manager to configure a bus of a device according to a segmented interconnect configuration, the segmented interconnect configuration based on operational parameters associated with the device and operational constraints associated with program modules to be executed by reconfigurable resources at the device.

At least one example embodiment provides a device architecture comprising: at least one memory and means for configuring a bus of a device according to a segmented interconnect configuration, the segmented interconnect configuration based on operational parameters associated with the device and operational constraints associated with program modules to be executed by reconfigurable resources at the FPGA.

At least one example embodiment provides a non-transitory computer-readable medium storing computer readable instructions that, when executed by at least one processor at a device configuration manager, cause the device configuration manager to perform a method comprising: configuring a bus of a device according to a segmented interconnect configuration, the segmented interconnect configuration computed based on operational parameters associated with the device and operational constraints associated with program modules to be executed by reconfigurable resources at the device.

At least one example embodiment provides a method comprising: configuring a bus of a device according to a segmented interconnect configuration, the segmented interconnect configuration computed based on operational parameters associated with the device and operational constraints associated with program modules to be executed by reconfigurable resources at the device.

The device architecture may be a field programmable gate array (FPGA) architecture, the configuration manager may be a FPGA configuration manager, and the bus may be a FPGA bus.

The FPGA architecture may further include a FPGA configurator configured to compute the segmented FPGA interconnect configuration based on the operational parameters and the operational constraints.

The FPGA architecture may further include a FPGA including the FPGA configurator.

The FPGA configuration manager may be configured to select a bitstream for configuring the FPGA configurator from a library of bitstreams.

The operational parameters may include a spatial and temporal allocation of the reconfigurable resources at the FPGA.

The FPGA bus may include a plurality of FPGA bus segments, and the segmented FPGA interconnect configuration may include operational characteristics associated with the FPGA bus segments.

The operational characteristics associated with a FPGA bus segment among the FPGA bus segments may include at least one of: a bandwidth, a number of inter-segment buffers, or a number of segment-module buffers.

According to one or more example embodiments, the method may further include computing the segmented FPGA interconnect configuration based on the operational parameters and the operational constraints.

The method may further include: selecting a bitstream for configuring the FPGA configurator from a library of bitstreams.

BRIEF DESCRIPTION OF THE DRAWINGS

Example embodiments will become more fully understood from the detailed description given herein below and the accompanying drawings, wherein like elements are represented by like reference numerals, which are given by way of illustration only and thus are not limiting of this disclosure.

Figure 1:
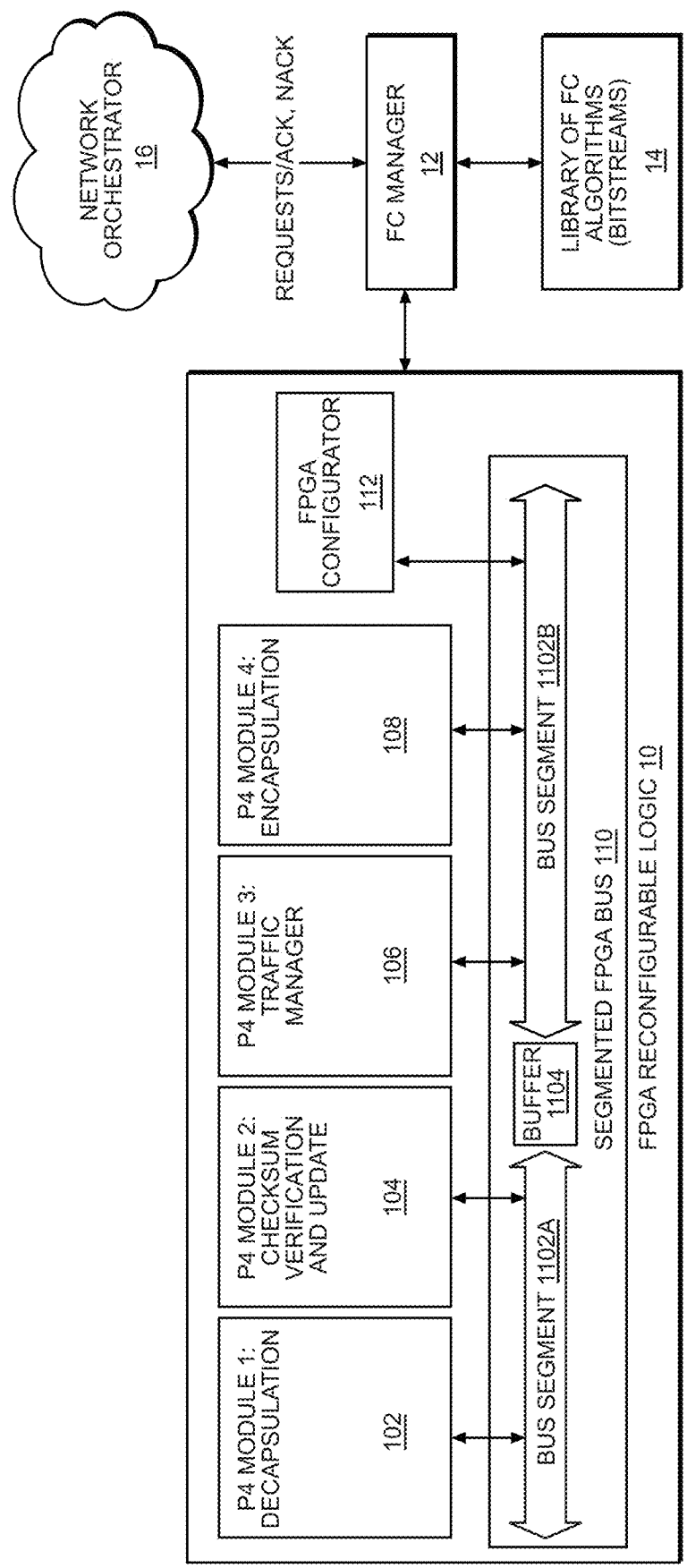
FIG. 1 is a block diagram illustrating a field programmable gate array (FPGA) architecture according to example embodiments.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. The use of similar or identical reference numbers in the various drawings is intended to indicate the presence of a similar or identical element or feature.

DETAILED DESCRIPTION

Various example embodiments will now be described more fully with reference to the accompanying drawings in which some example embodiments are shown.

Detailed illustrative embodiments are disclosed herein. However, specific structural and functional details disclosed herein are merely representative for purposes of describing example embodiments. The example embodiments may, however, be embodied in many alternate forms and should not be construed as limited to only the embodiments set forth herein.

Accordingly, while example embodiments are capable of various modifications and alternative forms, the embodiments are shown by way of example in the drawings and will be described herein in detail. It should be understood, however, that there is no intent to limit example embodiments to the particular forms disclosed. On the contrary, example embodiments are to cover all modifications, equivalents, and alternatives falling within the scope of this disclosure. Like numbers refer to like elements throughout the description of the figures.

In modern cloud-based data centers, servers are equipped with reconfigurable hardware (e.g., field-programmable gate arrays (FPGAs)), which is used to accelerate the computation of data-intensive or time-sensitive applications.

FPGA reconfigurability is referred to as "partial reconfiguration," which supposes that parts of FPGA hardware may be reconfigured while the FPGA is running. The partial reconfiguration is performed on allocated portions of a FPGA chip (or FPGA reconfigurable logic), which are known as "partial reconfiguration slots."

Segmented buses are interconnect architectures that may reduce wiring and/or load capacitance by partitioning a system bus into two or more segments that are interfaced by bridge or switch units (e.g., to connect different clock domains) or by buffers. Each segment behaves as a normal bus (e.g., with masters and slaves) shared between a reduced set of modules local to the segment. Each segment operates in parallel with other segments and unused segments may be selectively deactivated to save energy. A segmented bus configuration allows for isolation of execution units that communicate more frequently. Thus, multiple communications may occur simultaneously on different segments, which may reduce overall latency and power consumption of the interconnect architecture.

In conventional FPGA designs, either (i) a single shared bus may be used or (ii) buses may be segmented into two parts: one for higher-speed processing units and one for lower-speed or peripheral units. For a segmented bus, inter-segment communications are typically governed by a central arbiter that receives/dispatches signals from/to arbiters that are local to respective segments. However, this may complicate inter-dependencies at the FPGA because of, for example, mapping (spatial allocation of functions to platform units), scheduling (temporal allocation for units to execute functions) and/or interconnect configurations (number and type of units per segment).

One or more example embodiments provide a more efficient, deterministic and/or dynamic segmentation of an interconnect (segmented FPGA bus or shared FPGA bus) within a FPGA. One or more example embodiments may reduce latency and/or power consumption associated with a workload at a FPGA.

Example embodiments leverage the ability to adapt FPGA interconnects to better serve the requirements of, for example, a programming-based reconfigurable design. For example, one or more example embodiments provide a FPGA architecture and methods for more efficient, deterministic reconfiguration of FPGA interconnects and/or access to programming modules, such as Programming Protocol-independent Packet Processors (P4) modules.

P4 is a novel data-plane programming language enabling data-plane programming during the exploitation lifetime of a device. P4 provides a novel paradigm, which differs from the approach used by traditional Application Specific Integrated Circuit (ASIC)-based devices (e.g., switches). Furthermore, P4 is target-independent in that the programming language may be applied to central processing units (CPUs), FPGAs, system-on-chips (SoCs), etc., and is protocol-independent in that the programming language supports all data-plane protocols and may be used to develop new protocols.

When implemented on FPGAs, P4 applications allow for reprogramming of only some portions of a FPGA (a portion of the partial reconfiguration slots), without stopping (or interrupting) operation of the device.

P4 applications are composed of P4 modules that use different reconfigurable portions of FPGA's resources. Each P4 module has different interconnect bandwidth and latency requirements. This latency includes processing time necessary to transform input data into output data as well as the time for communications necessary to move data from/to memory (e.g., FPGA off-chip random access memory (RAM)) or from/to other P4 modules.

The functionality and FPGA resources of a P4 module may be fixed when the module is deployed. However, the workload of the P4 module may change at run-time. As a consequence, the bandwidth and/or latency requirements of the P4 module may change dynamically, and the interconnect configuration that was computed prior to deployment may become less efficient. One or more example embodiments may improve efficiency by enabling the interconnect configuration to be updated dynamically in response to these dynamic changes.

Although discussed herein with regard to P4 modules and workloads, example embodiments should not be limited to this example. Rather, example embodiments may be applicable to any kind of workload. Moreover, the scenarios discussed herein focus primarily on bandwidth and latency requirements associated with a change in workload, which may also be valid when a FPGA is reconfigured to execute another type of workload (e.g., video processing, financial applications, bioinformatics, etc.). In general, the requirements of a workload $W_1$ executed in the time interval between $t_1$ to $t_1$+latency($W_1$), where latency(x) is the latency of execution of workload x on the FPGA chip, are different from those of workload $W_2$ executed subsequently during a time interval from $t_2$ (where $t_2 \geq t_1$+latency($W_2$)). For this reason, regardless of the type of workload, the interconnect configuration of the FPGA may require adjustment to respond to the requirements of the specific workload.

One or more example embodiments provide a FPGA architecture, method enabling FPGA reconfiguration (and/or installation of new programming modules) in deterministic time, and/or a non-transitory computer-readable storage medium, with improved (e.g., optimal) use of the FPGA interconnection bus. As discussed in more detail below, the FPGA architecture may include a plurality of reconfigurable resources (e.g., partial reconfiguration slots), a segmented FPGA bus, FPGA configurator (FC), FC manager and library of algorithms (bitstreams). The library of algorithms may be installed on the FPGA's off-chip memory.

FIG. 1 is a block diagram illustrating a FPGA architecture according to example embodiments.

Referring to FIG. 1, the FPGA architecture includes a FPGA reconfigurable logic (also referred to as a FPGA or FPGA logic) 10, FC manager 12 and a library of FC algorithms (bitstreams) 14. As mentioned similarly above, the library of FC algorithms 14 may be installed on the FPGA's off-chip memory.

The FPGA reconfigurable logic 10 includes a plurality of partial reconfiguration slots 102, 104, 106, 108, a segmented FPGA bus 110, and a FC 112. Each of the partial reconfiguration slots 102, 104, 106, 108 includes a set of FPGA reconfigurable resources (e.g., Digital Signal Processors (DSPs), memory blocks, logic blocks, etc.) and may be allocated to, for example, a respective P4 module when the P4 module is deployed. The amount of resources per slot may vary. For example purposes, P4 modules Decapsulation, Checksum Verification and Update, Traffic Manager, and Encapsulation are shown in FIG. 1. However, example embodiments should not be limited to these examples.

The FPGA architecture shown in FIG. 1 is connected to a network orchestrator 16 via the FC manager 12. The network orchestrator 16 is configured to deploy P4 programs (or any other workload) to the FPGA reconfigurable logic 10.

The segmented FPGA bus 110 includes bus segment 1102A and bus segment 1102B, which interface via an inter-segment buffer 1104. Although only two segments are shown in FIG. 1 for example purposes, example embodiments should not be limited to this example. Although not shown in FIG. 1, the FPGA architecture may also include segment-to-module buffers between the bus segments and the respective P4 modules (or partial reconfiguration slots).

A FPGA bus, such as the segmented FPGA bus 110 in FIG. 1, is the default bus interconnect on FPGAs to interconnect reconfigurable resources, such as partial reconfiguration slots 102, 104, 106, 108 and FC 112. By default, all partial reconfiguration slots on the FPGA may have access to this bus.

One or more example embodiments provide additional functionality of a FPGA bus (e.g., segmented FPGA bus 110), which allows for more efficient and/or deterministic use of resources and interconnection reconfiguration or reprogramming. According to one or more example embodiments, the segmented FPGA bus 110 may be reconfigured each time the FPGA reconfigurable logic 10 is reconfigured with one or more new P4 modules.

Still referring to FIG. 1, the FC 112 communicates with the FC manager 12 to deterministically compute or re-compute a/an (e.g., optimal or improved) FPGA interconnect configuration (segmented FPGA interconnect configuration) to place and map P4 modules on different portions of the partial reconfiguration slots of the FPGA reconfigurable logic 10, depending on the FPGA bus segments to which the partial reconfiguration slots are connected. The FPGA interconnect configuration may include operational characteristics for the FPGA bus, such as, a number and/or bandwidth of segments of the FPGA bus, a number and/or bandwidth of inter-segment buffers, a number and/or bandwidth of segment-to-module buffers, or the like.

A number and/or bandwidth of bus segments may depend on the P4 modules to be interconnected and the workload that the P4 modules impose on the interconnect. Typically, all modules that communicate relatively frequently or exchange relatively large volumes of data may be connected to the same segment and/or are allocated a relatively large bandwidth. In a relatively simple example, the FC 112 (through the use of algorithms in the library of FC algorithms 14) may determine a number and bandwidth of bus segments for the FPGA interconnect based on a threshold. The threshold may be based on a designer's experience and/or on constraints related to timing (communication latency) and the availability of FPGA resources.

In one example, the number of segments S to instantiate may be established according to Equation (1) shown below.

$$S = \left\lceil \frac{P}{x} \right\rceil (x \geq 1) \quad (1)$$

In this example, P is the number of pairs of communicating sender-receiver modules, x is a positive finite integer determining how many pairs are assigned to a segment (e.g., x=1 means 1 pair/segment, x=2 means 2 pairs/segment, etc.; S is not defined for x=0). A fraction of the total interconnect bandwidth may then be assigned to each segment as in the following example.

If B is the total bandwidth available in the interconnect, and S1, S2, S3 are the segments that may be created, then the FC 112 may allocate all modules that require more than 0.5*B to communicate to segment S1, all modules that require a bandwidth between 0.3*B and 0.5*B to segment S2, and all remaining modules to segment S3.

The number of inter-segment buffers may depend on parameters such as volume of data, production/consumption rates of data, etc. In one example, the buffer size is proportional (e.g., directly proportional) to the volume of exchanged data and to the production/consumption rates. A buffer may be allocated for each pair of communicating modules, in their respective segments. The FC 112 may (through the use of algorithms in the library of FC algorithms 14) determine the number of inter-segment buffers based on the parameters. In a simple example, assume V is the total volume of data exchanged by all modules, and Q is the total amount of memory that may be allocated for these buffers in the interconnect. In this example, the FC 112 may allocate all modules that exchange more than 0.5*V buffers of total size 0.5*Q in segment S1, may allocate all modules that exchange volumes of data between 0.3*V and 0.5*V buffers of total size 0.3*Q in segment S2, and may allocate all remaining modules buffers whose total size is 0.2*Q in segment S3.

The number of segment-to-module buffers may depend on the communication needs of a given module. For modules that either only produce or only consume data, one buffer may be sufficient. For modules that need to send and receive data, two buffers may be needed. One such a buffer may be allocated, in the general case, for each pair of communicating modules, in their respective segments.

Returning to FIG. 1, the FC manager 12 interfaces and communicates with the FC 112. The FC manager 12 also manages communications (e.g., requests, acknowledgements, negative acknowledgements, etc.) with the network orchestrator 16, and may select an implementation of the FC 112 from the library of FC algorithms 14 (e.g., at start up).

According to one or more example embodiments, the library of FC algorithms 14 may be a database storing input/output data and instructions for P4 modules and is configured to communicate with FC manager 12. The library of FC algorithms 14 stores FPGA implementations for different FCs, wherein each entry in the library implements an algorithm that determines allocation of FPGA resources, scheduling FPGA resources, and an interconnect configuration for the FPGA reconfigurable logic 10. The library of FC algorithms 14 will be discussed in more detail later.

Figure 2:
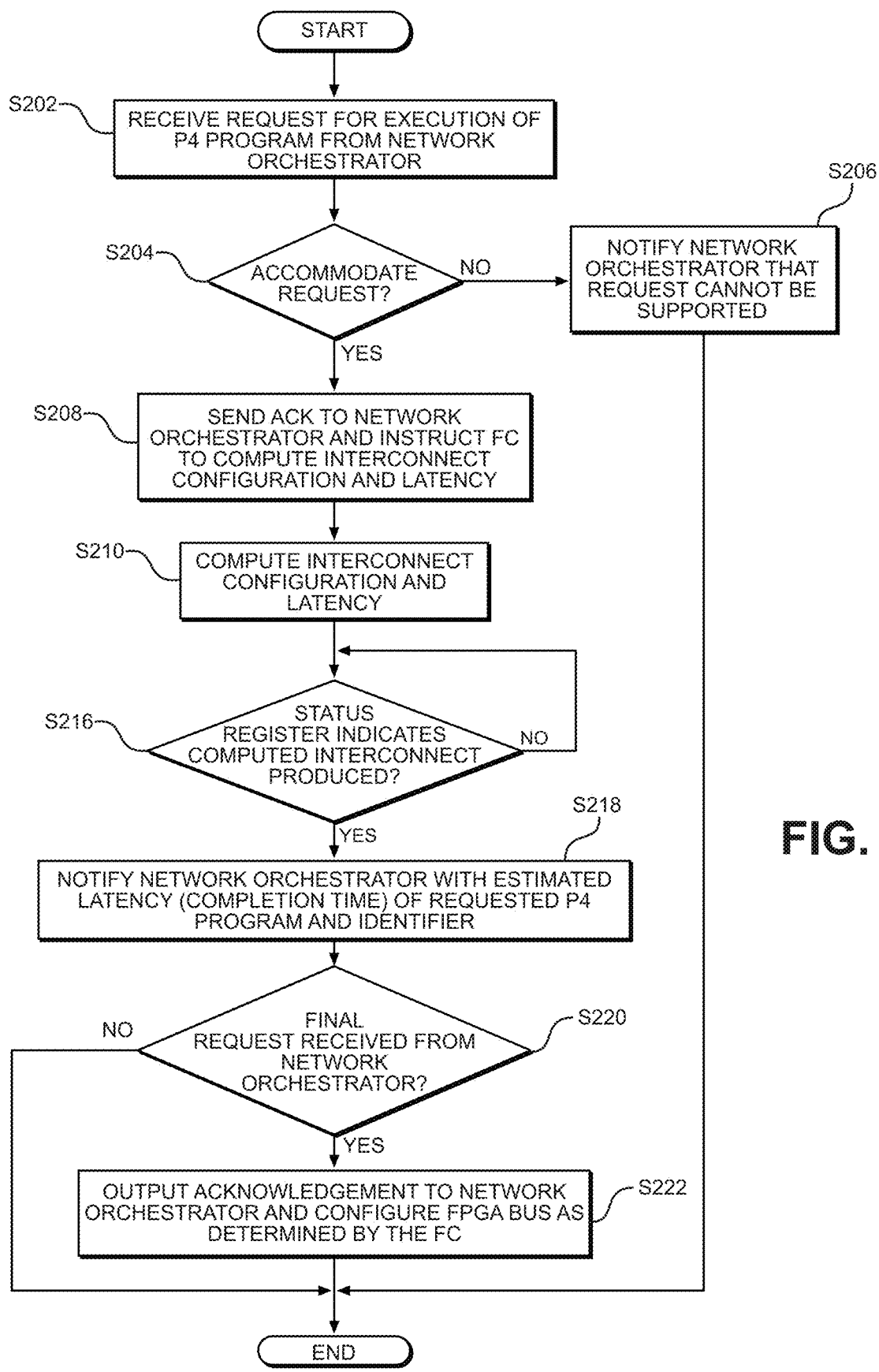
FIG. 2 is a flow chart illustrating a method according to example embodiments.

FIG. 2 is a flow chart illustrating a method for configuring a bus interconnect at a FPGA according to example embodiments. The method shown in FIG. 2 may be executed by the FPGA architecture shown in FIG. 1, and will be discussed in this manner for example purposes. However, example embodiments should not be limited to only this example. Moreover, the example embodiment shown in FIG. 2 will be described with regard to operations performed by elements/components of the FPGA architecture shown in FIG. 1. However, it should be understood that the example embodiment may be described, in at least some instances, similarly with regard to the operations being performed by at least one processor in conjunction with at least one memory and computer program code stored in the at least one memory, wherein the at least one memory and the computer program code are configured to, with the at least one processor, to cause the element(s) of the FPGA architecture to perform the respective operations.

Referring to FIG. 2, at step S202, the FC manager 12 receives a request for execution of a P4 program (or set of P4 programs) from the network orchestrator 16. The request from the network orchestrator 16 may include a set of P4 modules (for a given P4 program or set of P4 programs) and time constraints (e.g., threshold latency requirements) for the P4 modules.

In response to receiving the request from the network orchestrator 16, at step S204 the FC manager 12 sends an acknowledgement to the network orchestrator 16, and polls a status register (not shown) at the FC 112 to determine whether the FC 112 and the FPGA reconfigurable logic 10 are able to accommodate the request. The status register may be a memory or portion thereof programmed with a code indicating a particular status of the FC 112. In one example, a first code may indicate that the FPGA reconfigurable logic 10 is able to accommodate requests from the network orchestrator 16, whereas a second code may indicate that the FPGA reconfigurable logic 10 is unable to accommodate requests from the network orchestrator 16. In one example, the FPGA reconfigurable logic 10 may be unable to accommodate requests from the network orchestrator 16, and programmed with the second code, when there are no additional resources available to accommodate new P4 modules.

If the status register indicates that the FPGA reconfigurable logic 10 is unable to accommodate the request, then at step S206 the FC manager 12 notifies the network orchestrator 16 that the request cannot be supported at the FPGA reconfigurable logic 10 (e.g., by sending a negative acknowledgment (NACK)), and the process terminates.

Returning to step S204, if the status register indicates that the request can be accommodated, then at step S208 the FC manager 12 outputs an acknowledgement (ACK) to the network orchestrator 16 indicating the same. Also at step S208, the FC manager 12 instructs the FC 112 to compute an interconnect configuration and estimated latency associated with the requested P4 program. The FC manager 12 also sends to the FC 112 information (e.g., a Look-Up Table) about the current (e.g., spatial and/or temporal) status of the FPGA reconfigurable logic 10 (e.g., the current allocation of P4 modules onto partitions, the current memory footprint, etc.).

At step S210, the FC 112 deterministically computes the interconnect configuration for (including segmentation of) the FPGA bus 110 (also referred to sometimes as a FPGA interconnect) for the requested P4 program. Also at step S210, the FC 112 computes the estimated latency at which packets may be processed by the requested P4 program given the computed interconnect configuration. This information is stored on the local RAM memory at the FPGA reconfigurable logic 10.

In one example, the FC 112 deterministically computes the interconnect configuration based on operational parameters associated with the FPGA reconfigurable logic 10 and operational constraints associated with the requested P4 module or set of P4 modules. The operational parameters may include spatial and temporal allocation of the requested and existing P4 modules at the FPGA (e.g., provided by the FC manager 12 at step S208). The operational constraints may include timing constraints associated with the requested P4 modules. The FC 112 may also consider an overall latency at the FPGA reconfigurable logic 10 in deterministically computing the interconnect configuration.

The FC 112 takes into account spatial allocations in association with constraints that limit the number of FPGA resources (e.g., memory for buffers, reconfigurable logic for modules, etc.) that can be allocated during a given time window (e.g., lifetime of a set of P4 modules). The FC 112 accounts for temporal allocations in association with timing parameters (e.g., production/consumption rates, deadlines, etc.) that regulate the choice of some characteristics of the interconnect (e.g., buffer size, number of segments, etc.). In one example, the greater the number of segments, the longer the communication latency in the interconnect.

According to example embodiments, upon initiation of step S210, the FC 112 updates the status register (e.g., with a third code) to indicate that the interconnect configuration is currently being computed. Once complete (e.g., after a deterministic time), the FC 112 updates the status register (e.g., with a fourth code, or alternatively the above-discussed first code) to indicate that the computation of the interconnect configuration is complete.

In more detail, for example, at step S210, in a deterministic time, the FC 112 computes an interconnect configuration (e.g., including a number of bus segments, a number of partial reconfiguration slots per segment, mapping of P4 modules to partial reconfiguration slots, etc.) that reduces and/or minimizes the overall latency, but also satisfies the timing constraints of the P4 modules in the request. As mentioned above, the FC 112 also computes the latency at which packets can be processed by the P4 program, given the new FPGA configuration.

The estimated latency at which packets may be processed by the requested P4 program given the computed interconnect configuration may be in the form of an upper bound of the worst case latency for packets to traverse the segmented interconnect. The exact latency may depend on run-time parameters such as the size of packets and the status of the segmented interconnect (e.g., which packets are in which buffers, a respective segment's scheduling policy, etc.). The worst-case latency for packets to traverse the segmented interconnect may be stored in a LUT addressed by an identifier for each segment.

According to one or more example embodiments, the FC 112 may compute a new interconnect configuration according to a fixed objective function in which the criteria to compute the interconnect configuration is fixed (e.g., the objective to minimize the latency of P4 modules). Alternatively, example embodiments may also support custom, variable objective functions, that is to say, for example, that the objective function of a FC algorithm may vary at run-time. In this case, the objective function is provided to the FC manager 12 by the network orchestrator 16 (e.g., as a parameter in the request from the network orchestrator 16). The FC manager 12 may forward this objective to the FC 112 as an additional parameter (e.g., a hexadecimal code). In this case, the FC 112 may use a criteria that is part of a request from the network orchestrator 16, such as minimize latency, minimize power consumption, minimize number of segments, etc.

Apart from minimizing latency, other relevant objective functions may include: minimizing the power consumption of the FPGA, maximizing the throughput of data processed by P4 modules, or the like. Some FC algorithms may also allow for computing a new interconnect configuration by accounting for combinations of objective functions (multi-objective optimizations, e.g., to minimize both latency and power consumption).

According to example embodiments, the deterministic time at step S210 is possible because the FC 112 executes directly on the FPGA reconfigurable logic 10 without sources of non-determinism (e.g., caches, interrupts, etc.).

An example computation of an interconnect configuration will now be described for example purposes. It is noted, however, that example embodiments should not be limited to this example.

According to at least one example embodiment, the FC 112 determines a number of segments and their associated bandwidths, for example, as described above with regard to Equation (1). The FC 112 then computes an allocation of modules by studying graph cuts (e.g., partitions of nodes into distinct sets) of the module dependency graph (e.g., a graph whose nodes represent the P4 modules, wherein edges denote the communications between modules and edge weights denote the amount of data to transfer). In one example, if the objective function is to maximize throughput, then graph cuts are dimensioned so that the total weight of the graph edges between cuts (sets of nodes) is maximized. Subsequently, the graph cut edges are allocated to segments proportionally to the each segment's bandwidth (e.g., the largest graph cut is mapped to the segment with the largest bandwidth, the second largest graph cut is allocated to the segment with the second largest bandwidth, etc.). This allocation of graph edges (allocation of data-transfers) also defines an allocation of graph nodes associated to edges (allocation of tasks) to the platform processing elements (e.g., CPUs, DSPs). By default, the size of inter-segment buffers may be an integer multiple of the size of the largest packet. According to one or more example embodiments, arbitration at inter-segment switches may be, by default, a simple first-come-first-served or a priority-based algorithm.

Still referring to FIG. 2, at step S216 the FC Manager 12 polls the status register (not shown) of the FC 112 as discussed above with regard to step S204. Although shown as subsequent to step S210 in FIG. 2, the FC manager 12 may begin polling (e.g., periodically) the status register of the FC 112 upon initiation of the computation of the interconnect configuration and latency at step S210.

If the status register of the FC 112 indicates that results of the interconnect configuration are computed (e.g., the value of the status register is set to the first or the fourth code), then at step S218 the FC Manager 12 notifies the network orchestrator 16 that the computation has completed. In one example, the FC manager 12 generates a message including the latency (or completion time) of the requested P4 program (computed at step S210) as well as the identifier of the requested P4 program, and sends the message to the network orchestrator 16.

At step S220, the FC manager 12 determines whether further instructions (e.g., a final request) have been received from the network orchestrator 16 in response to the message sent at step S218.

Although not shown in FIG. 2, in response to receiving the estimated latency (completion time) from the FC manager 12, the network orchestrator 16 determines whether the latency computed at step S210 satisfies the service requirements (e.g., latency) for execution of the requested P4 program. If the network orchestrator 16 determines that the latency that can be provided by the FPGA reconfigurable logic 10 matches (or exceeds) the service requirements, then in at least one example the network orchestrator 16 sends a final request to the FC manager 12. In one example, the final request may include the bitstreams (FPGA executables) for implementing the P4 modules.

Still referring to FIG. 2, if the FC manager 12 receives a final request to execute the P4 program at the FPGA reconfigurable logic 10, then at step S222 the FC manager 12 outputs an acknowledgement to the network orchestrator 16 acknowledging the final request, and (re)configures the FPGA bus 110 as determined by the FC 112. The FC manager 12 then returns to the idle state/phase (e.g., to await further instructions/requests from the network orchestrator 16).

Returning to step S220, if the FC manager 12 does not receive a final request from the network orchestrator 16 (e.g., within a threshold time period), then the segmented FPGA bus 110 is not reconfigured, and the process terminates.

Returning to step S216, if the status register does not indicate that the computation of the interconnect configuration is complete, then the FC manager 12 continues to poll the status register (e.g., periodically). Once the status register indicates that the computation of the interconnect configuration is completed, the process proceeds to step S218 and continues as discussed above.

The example embodiment shown in FIG. 2 may be performed iteratively in response to requests from the network orchestrator 16. For the sake of brevity, however, only a single iteration is discussed herein.

Example embodiments may be capable of managing multiple requests for different P4 programs (e.g., requests may be stored in a queue internal to the FC manager 12 that is asynchronously inspected by the FC manager 12). The FC manager 12 may handle the status of each request and communicate results to the network orchestrator 16 by referring to a P4 program identifier (ID) contained in the initial request from the network orchestrator 16.

For the sake of simplicity, example embodiments are discussed with regard to the FC 112 computing one interconnect configuration at a time. However, example embodiments should not be limited to this example. Rather, the FC 112 may compute any number of configurations concurrently or simultaneously.

For the sake of simplicity, the example embodiment shown in FIG. 2 is described with regard to steps S208 and S210, wherein it is assumed that the FC 112 uses a fixed algorithm to compute interconnect configurations. More specifically, for example, it is assumed that, at start-up, the FPGA reconfigurable logic 10 is configured with the fixed algorithm, and then at run-time the FC 112 utilizes this fixed algorithm.

However, example embodiments may utilize the library of FC algorithms 14 to change the algorithm used by the FC 112 dynamically. The library of FC algorithms 14 may reside locally in the FPGA RAM memory or may be provided externally by the network orchestrator 16, on the fly. The library of FC algorithms 14 is a collection of FPGA bitstreams, each of which implements a different algorithm to compute an interconnect configuration. Examples of these algorithms are heuristics (e.g., allocate P4 modules to a bus segment based on different criteria such as the frequency of communications, the volume of exchanged data, etc.) and exact algorithms (that produce latency-optimal solutions). These algorithms may differ in terms of non-functional characteristics (e.g., the latency taken to produce a solution, in the number of objective functions supported) as well as in terms of functional characteristics (e.g., the type of target FPGA, the type of interconnect arbitration, the type of bus protocols, etc.).

In example embodiments in which the library of FC algorithms 14 is available, the requests from the network orchestrator 16 also include a field that provides an ID for the specific algorithm to use to compute an interconnect configuration at step S210 in FIG. 2. Thus, in this example embodiment, at step S208, the FC manager 12 also provides to the FC 112 with the bitstream of the desired algorithm, which is retrieved from the library of FC algorithms 14 and installed at the FC 112 to configure the FC 112 computing the new interconnect configuration at step S210.

In case the library of FC algorithms 14 resides locally on the FPGA RAM memory, a communication mechanism may be provided between the network orchestrator 16 and the FC manager 12 to update the library of FC algorithms 14 (e.g., to store new algorithms and/or delete old algorithms) as needed.

Example embodiments are discussed herein with regard to one partial reconfiguration slot executing a single P4 module, which mitigates the need to compute a scheduling for each of the partial reconfiguration slots because their execution is simply dictated by the availability of input data. However, example embodiments should not be limited to this example.

According to one or more example embodiments, FPGAs may provide pre-fabricated wires and programmable switches that may be used to realize different ad-hoc communication architectures. In accordance with one or more example embodiments, a user may configure these wires and switches to implement an ad-hoc bus that is initially not shared (e.g., connected to a single module), but then becomes shared upon implementation of one or more example embodiments described herein (e.g., when one or more additional modules are connected to the ad-hoc bus.

Further still, a FPGA may include a plurality of reconfigurable interconnect resources (e.g., wires, switches, buses, etc.). These interconnect resources are reconfigurable resources for transferring information, as opposed to the resources for processing information (e.g., slots of the FPGA).

According to one or more example embodiments, the FC 112 may compute a configuration for the FPGA interconnect resources, where these resources are segmented and the segments themselves are associated with a generic list of operational characteristics.

Figure 3:
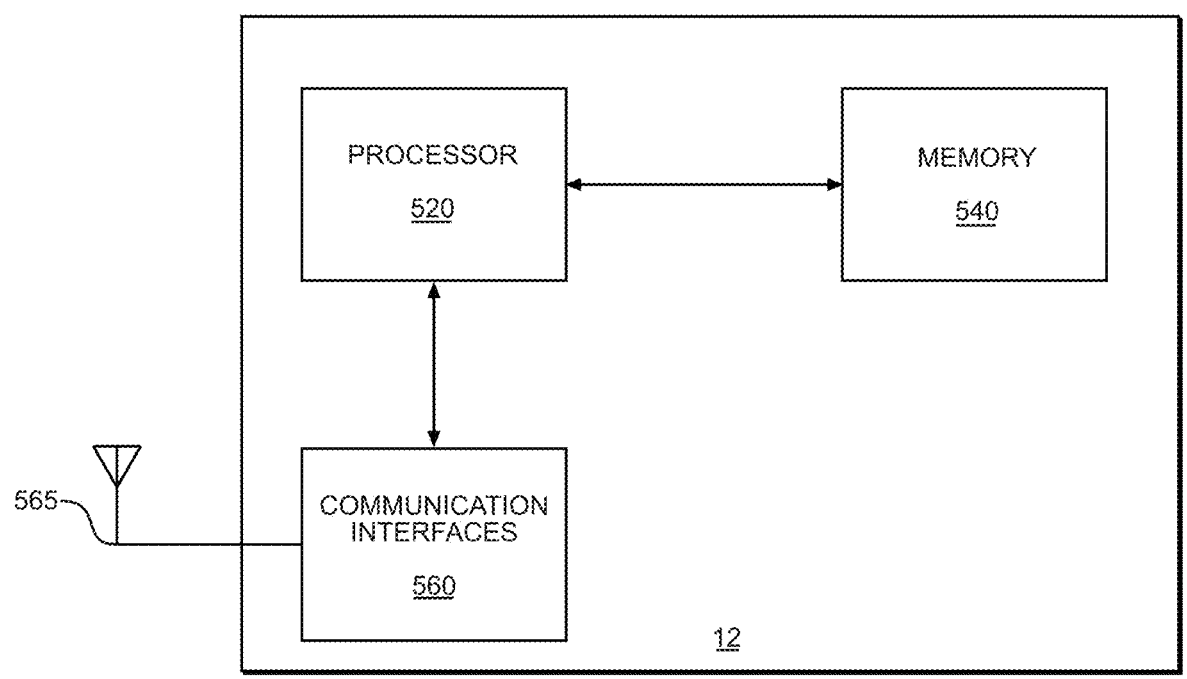
FIG. 3 is a block diagram illustrating a FPGA configurator manager according to example embodiments.

FIG. 3 illustrates an example embodiment of a FC manager. Although a FC manager is discussed, the structure shown in FIG. 3 may also serve as the network orchestrator 16, library of FC algorithms 14, etc.

As shown, the FC manager 12 includes: a memory 540; a processor 520 connected to the memory 540; various interfaces 560 connected to the processor 520; and one or more antennas or antenna panels 565 connected to the various interfaces 560. The various interfaces 560 and/or the antenna 565 may constitute a transceiver for transmitting/receiving data from/to other network nodes and/or LANs via a wired or wireless links. As will be appreciated, depending on the implementation of the FC manager 12, the FC manager 12 may include many more components than those shown in FIG. 3. However, it is not necessary that all of these generally conventional components be shown in order to disclose the illustrative example embodiment.

The memory 540 may be a computer readable storage medium that generally includes a random access memory (RAM), read only memory (ROM), and/or a permanent mass storage device, such as a disk drive. The memory 540 also stores an operating system and any other routines/modules/applications for providing the functionalities of the FC manager 12 to be executed by the processor 520. These software components may also be loaded from a separate computer readable storage medium into the memory 540 using a drive mechanism (not shown). Such separate computer readable storage medium may include a disc, tape, DVD/CD-ROM drive, memory card, or other like computer readable storage medium (not shown). In some example embodiments, software components may be loaded into the memory 540 via one of the various interfaces 560, rather than via a computer readable storage medium.

The processor 520 may be configured to carry out instructions of a computer program by performing the arithmetical, logical, and input/output operations of the system. Instructions may be provided to the processor 520 by the memory 540.

The various interfaces 560 may include components that interface the processor 520 with the antenna 565, or other input/output components. As will be understood, the various interfaces 560 and programs stored in the memory 540 to set forth the special purpose functionalities of the FC manager 12 will vary depending on the implementation of the FC manager 12. The interfaces 560 may also include one or more user input devices (e.g., a keyboard, a keypad, a mouse, or the like) and user output devices (e.g., a display, a speaker, or the like).

Example embodiments may reduce latency and/or power consumption in segmented bus architectures deployed in FPGA architectures.

Although the terms first, second, etc. may be used herein to describe various elements, these elements should not be limited by these terms. These terms are only used to distinguish one element from another. For example, a first element could be termed a second element, and similarly, a second element could be termed a first element, without departing from the scope of this disclosure. As used herein, the term "and/or," includes any and all combinations of one or more of the associated listed items.

When an element is referred to as being "connected," or "coupled," to another element, it can be directly connected or coupled to the other element or intervening elements may be present. By contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

As discussed herein, illustrative embodiments will be described with reference to acts and symbolic representations of operations (e.g., in the form of flow charts, flow diagrams, data flow diagrams, structure diagrams, block diagrams, etc.) that may be implemented as program modules or functional processes include routines, programs, objects, components, data structures, etc., that perform particular tasks or implement particular abstract data types and may be implemented using existing hardware at, for example, existing network apparatuses, elements or entities including cloud-based data centers, computers, cloud-based servers, or the like. Such existing hardware may be processing or control circuitry such as, but not limited to, one or more processors, one or more Central Processing Units (CPUs), one or more controllers, one or more arithmetic logic units (ALUs), one or more digital signal processors (DSPs), one or more microcomputers, one or more field programmable gate arrays (FPGAs), one or more System-on-Chips (SoCs), one or more programmable logic units (PLUs), one or more microprocessors, one or more Application Specific Integrated Circuits (ASICs), or any other device or devices capable of responding to and executing instructions in a defined manner.

Although a flow chart may describe the operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium," "computer readable storage medium" or "non-transitory computer readable storage medium" may represent one or more devices for storing data, including read only memory (ROM), random access memory (RAM), magnetic RAM, core memory, magnetic disk storage mediums, optical storage mediums, flash memory devices and/or other tangible machine-readable mediums for storing information. The term "computer-readable medium" may include, but is not limited to, portable or fixed storage devices, optical storage devices, and various other mediums capable of storing, containing or carrying instruction(s) and/or data.

Furthermore, example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, a processor or processors will perform the necessary tasks. For example, as mentioned above, according to one or more example embodiments, at least one memory may include or store computer program code, and the at least one memory and the computer program code may be configured to, with at least one processor, cause a network apparatus, network element or network device to perform the necessary tasks. Additionally, the processor, memory and example algorithms, encoded as computer program code, serve as means for providing or causing performance of operations discussed herein.

A code segment of computer program code may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable technique including memory sharing, message passing, token passing, network transmission, etc.

The terms "including" and/or "having," as used herein, are defined as comprising (i.e., open language). The term "coupled," as used herein, is defined as connected, although not necessarily directly, and not necessarily mechanically. Terminology derived from the word "indicating" (e.g., "indicates" and "indication") is intended to encompass all the various techniques available for communicating or referencing the object/information being indicated. Some, but not all, examples of techniques available for communicating or referencing the object/information being indicated include the conveyance of the object/information being indicated, the conveyance of an identifier of the object/information being indicated, the conveyance of information used to generate the object/information being indicated, the conveyance of some part or portion of the object/information being indicated, the conveyance of some derivation of the object/information being indicated, and the conveyance of some symbol representing the object/information being indicated.

According to example embodiments, network apparatuses, elements or entities including cloud-based data centers, computers, cloud-based servers, or the like, may be (or include) hardware, firmware, hardware executing software or any combination thereof. Such hardware may include processing or control circuitry such as, but not limited to, one or more processors, one or more CPUs, one or more controllers, one or more ALUs, one or more DSPs, one or more microcomputers, one or more FPGAs, one or more SoCs, one or more PLUs, one or more microprocessors, one or more ASICs, or any other device or devices capable of responding to and executing instructions in a defined manner.

Benefits, other advantages, and solutions to problems have been described above with regard to specific embodiments of the invention. However, the benefits, advantages, solutions to problems, and any element(s) that may cause or result in such benefits, advantages, or solutions, or cause such benefits, advantages, or solutions to become more pronounced are not to be construed as a critical, required, or essential feature or element of any or all the claims.

Reference is made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the example embodiments are merely described below, by referring to the figures, to explain example embodiments of the present description. Aspects of various embodiments are specified in the claims.

What is claimed is:

1. A device comprising:
a plurality of reconfigurable resources, the plurality of reconfigurable resources including a plurality of partial reconfiguration slots, the plurality of partial reconfiguration slots being reconfigurable without interrupting operation of the device;
a bus interconnecting the plurality of reconfigurable resources; and
a configurator configured to deterministically compute a segmented interconnect configuration for the bus based on operational parameters associated with the device and operational constraints associated with program modules to be executed by the plurality of reconfigurable resources and based on an estimated latency for the segmented interconnect configuration, the operational constraints including a threshold latency, and the operational parameters including a spatial and temporal allocation of the plurality of partial reconfiguration slots of the plurality of reconfigurable resources at the device, wherein deterministically computing the segmented interconnect configuration includes determining whether the segmented interconnect configuration having the spatial and temporal allocation of the partial reconfiguration slots of the plurality of reconfigurable resources meets the operational constraints.

2. The device of claim 1, wherein
the bus includes a plurality of bus segments, and
the segmented interconnect configuration includes operational characteristics associated with the bus segments.

3. The device of claim 2, wherein the operational characteristics associated with a bus segment among the bus segments include at least one of
a bandwidth,
a number of inter-segment buffers, or
a number of segment-module buffers.

4. The device of claim 1, wherein the operational constraints include timing constraints for the program modules.

5. The device of claim 1, wherein
the device is a field programmable gate array (FPGA),
the bus is an FPGA bus, and
the configurator is an FPGA configurator.

6. A device architecture comprising:
a configuration manager including at least one processor and at least one memory including computer program code, the at least one memory and the computer program code configured to, with the at least one processor,
cause the configuration manager to configure a bus of a device according to a segmented interconnect configuration, the segmented interconnect configuration based on operational parameters associated with the device and operational constraints associated with program modules to be executed by reconfigurable resources at the device and based on an estimated latency for the segmented interconnect configuration, the reconfigurable resources including a plurality of partial reconfiguration slots, the plurality of partial reconfiguration slots being reconfigurable without interrupting operation of the device, the operational constraints including a threshold latency, and the operational parameters including a spatial and temporal allocation of the plurality of partial configuration slots of the reconfigurable resources at the device, wherein
configuring the bus of the device according to the segmented interconnect configuration includes determining whether the segmented interconnect configuration having the spatial and temporal allocation of the plurality of partial reconfiguration slots of the reconfigurable resources meets the operational constraints.

7. The device architecture of claim 6, further comprising:
a configurator configured to compute the segmented interconnect configuration based on the operational parameters and the operational constraints.

8. The device architecture of claim 7, wherein the configuration manager is configured to select a bitstream for configuring the configurator from a library of bitstreams.

9. The device architecture of claim 6, wherein
the bus includes a plurality of bus segments, and
the segmented interconnect configuration includes operational characteristics associated with the bus segments.

10. The device architecture of claim 9, wherein the operational characteristics associated with a bus segment among the bus segments include at least one of
a bandwidth,
a number of inter-segment buffers, or
a number of segment-module buffers.

11. The device architecture of claim 6, wherein
the device architecture is a field programmable gate array (FPGA) architecture,
the configuration manager is a FPGA configuration manager, and
the bus is an FPGA bus.

12. A non-transitory computer-readable medium storing computer readable instructions that, when executed by at least one processor at a device configuration manager, cause the device configuration manager to perform a method comprising:
configuring a bus of a device according to a segmented interconnect configuration, the segmented interconnect configuration computed based on operational parameters associated with the device and operational constraints associated with program modules to be executed by reconfigurable resources at the device and based on an estimated latency for the segmented interconnect configuration, the reconfigurable resources including a plurality of partial reconfiguration slots, the plurality of partial reconfiguration slots being reconfigurable without interrupting operation of the device, the operational constraints including a threshold latency, and the operational parameters including a spatial and temporal allocation of the plurality of partial reconfiguration slots of the reconfigurable resources at the device, wherein
configuring the bus of the device according to the segmented interconnect configuration includes determining whether the segmented interconnect configuration having the spatial and temporal allocation of the plurality of partial reconfiguration slots of the reconfigurable resources meets the operational constraints.

13. The non-transitory computer-readable medium of claim 12, wherein the method further comprises:
computing the segmented interconnect configuration based on the operational parameters and the operational constraints.

14. The non-transitory computer-readable medium of claim 12, wherein
the bus includes a plurality of bus segments, and
the segmented interconnect configuration includes operational characteristics associated with the bus segments.

15. The non-transitory computer-readable medium of claim 14, wherein the operational characteristics associated with a bus segment among the bus segments include at least one of
a bandwidth,
a number of inter-segment buffers, or
a number of segment-module buffers.

16. The non-transitory computer-readable medium of claim 12, wherein
the device configuration manager is a field programmable gate array (FPGA) device configuration manager, and
the bus is a FPGA bus.

* * * * *